United States Patent [19]

Ideler et al.

[11] Patent Number: 5,113,145
[45] Date of Patent: May 12, 1992

[54] POWER AMPLIFIER FOR FEEDING AN INDUCTANCE WITH SWITCHED TRANSISTORS

[75] Inventors: Karl-Heniz Ideler, Spardorf; Stefan Nowak, Kalchreuth; Gunter Petzold, Nuremberg, all of Fed. Rep. of Germany

[73] Assignee: Siemens Aktiengesellschaft, Munich, Fed. Rep. of Germany

[21] Appl. No.: 661,219

[22] Filed: Feb. 27, 1991

[30] Foreign Application Priority Data

Mar. 9, 1990 [DE] Fed. Rep. of Germany ....... 4007566

[51] Int. Cl.$^5$ .............................................. H03F 3/217
[52] U.S. Cl. ........................................ 330/251; 330/66; 330/289; 330/207 A; 363/132; 363/98
[58] Field of Search ............... 330/251, 207 A, 144, 330/66, 289; 363/132, 98

[56] References Cited

U.S. PATENT DOCUMENTS

| | | | |
|---|---|---|---|
| 4,020,361 | 4/1977 | Suelzle et al. | 363/132 |
| 4,566,059 | 1/1986 | Gallios et al. | 363/98 |
| 4,616,305 | 10/1986 | Damiano et al. | 363/132 |
| 4,626,980 | 12/1986 | McGuire | 363/132 |
| 4,860,189 | 8/1989 | Hitchcock | 363/132 |
| 4,864,479 | 9/1989 | Steigerwald et al. | 363/132 |
| 4,884,186 | 11/1989 | Small | 363/132 |
| 4,901,216 | 2/1990 | Small | 363/132 |
| 4,914,399 | 4/1990 | Doany | 330/251 |
| 4,935,857 | 6/1990 | Nguyen et al. | 363/98 |
| 4,967,336 | 10/1990 | Davies et al. | 363/132 |

FOREIGN PATENT DOCUMENTS

| | | |
|---|---|---|
| 0185181 | 11/1985 | European Pat. Off. |
| 0217200 | 12/1986 | European Pat. Off. ............ 330/251 |
| 1114224 | 9/1961 | Fed. Rep. of Germany . |
| 3308328A1 | 9/1984 | Fed. Rep. of Germany . |
| 3312896A1 | 10/1984 | Fed. Rep. of Germany . |
| 3438034A1 | 4/1986 | Fed. Rep. of Germany . |
| 3615782A1 | 11/1987 | Fed. Rep. of Germany . |
| 2178243A | 2/1987 | United Kingdom . |

OTHER PUBLICATIONS

Brad Hall—"Parallelschaltung von Leistungs"—MOSFET Funk-Technik 41 (1986), pp. 465–467.

*Primary Examiner*—Eugene R. LaRoche
*Assistant Examiner*—Tan Dinh
*Attorney, Agent, or Firm*—Hill, Van Santen, Steadman & Simpson

[57] ABSTRACT

Switched transistors (T1 ... through T4 ...) are arranged in a bridge circuit such that a plurality of transistors (T1 ... through T4 ...) are connected in parallel in every bridge branch. These transistors are secured on a thermally and electrically conductive ring (R, R'), are symmetrically distributed over this ring (R1, R1'), and have a respective terminal electrically connected thereto. The connection to further terminals of the transistors (T1 ... through T4 ...) occurs essentially in rotationally-symmetrical fashion via large-area printed circuit boards (LE1 through LE6). Short connecting paths with low values of inductance are achieved with this arrangement. Furthermore, the waste heat from all transistors (T1 ... through T4 ...) is uniformly carried off via the rings (R1, R1'), so that all transistors (T1 .. . through T4 ...) work at the same temperature. A uniform current division onto all transistors (T1 ... through T4 ...) connected in parallel is assured with this arrangement, even in a dynamic case.

18 Claims, 4 Drawing Sheets

POWER AMPLIFIER FOR FEEDING AN INDUCTANCE WITH SWITCHED TRANSISTORS

BACKGROUND OF THE INVENTION

The invention is directed to a power amplifier for the feed of an inductance with switched transistors that are arranged in a bridge circuit in the diagonal of which the inductance is connected. Every transistor has a freewheeling diode allocated to it such that, when the transistor is deactivated, the diode assumes the current conduction thereof. A plurality of transistors are connected in parallel in every bridge branch.

Such a power amplifier is disclosed, for example, by DE-A1-34 38 034, incorporated herein by reference. An arbitrary current path in both directions can thus be set by an appropriate drive of the transistors of the bridge circuit. Compared to a linear amplifier concept, considerable advantages with respect to space requirement, dissipated power, and thus costs, result due to the switched operation of the transistors. Bipolar transistors having high performance capability are available, so that high currents can also be switched without having to connect a great number of transistors in parallel. A compact structuring technique having a short line layout, and thus a low line inductance, is thus possible. However, it is particularly the switching losses in bipolar transistors having high current-carrying capability that are still considerable due to limited switching speed, so that one quickly arrives into power regions wherein a water cooling is required. A serious disadvantage in the employment of bipolar switching transistors is the limited controllability of the power amplifier. As a consequence of the retention time, bipolar transistors having high current-carrying ability have a switch-off delay of approximately 5 $\mu$s. A noteworthy safety margin between the individual switching events must be observed because of this switch-off delay and because of the differences between bipolar transistor units. For two transistors which lie in series with respect to the operating voltage, two things are prevented: that they conduct simultaneously and that transverse currents arise. The necessary safety margin lies at approximately 10% of the switching cycle. In control-oriented terms, this safety margin acts as dead time, which is expressed as a deterioration of the obtainable curve shape, particularly given low currents.

Significantly higher switching speeds, and thus reduced switching losses, can be achieved with power MOSFET transistors. MOSFET transistors fundamentally have no retention time, so that the dead time can be noticeably reduced, and thus the controllability of an amplifier is improved. A disadvantage of the power MOSFET transistors compared to bipolar transistors is the lower current-carrying ability. When high currents are required from a power amplifier, many MOSFET transistors must be connected in parallel.

High demands made of power amplifiers occur, for example, in gradient amplifiers of nuclear magnetic resonance tomographs. Coil arrangements for generating linear magnetic field gradients must thus be supplied with current. For example, the following, typical demands made of such power amplifiers result:

(a) the currents must be capable of being exactly set in a range from 10 mA through 250 A;

(b) currents in two directions are required;

(c) a power curve shape prescribed by a drive must be reproduced as precisely as possible;

(d) the power amplifier must supply an output voltage that assures an adequate rate of the current rise in the gradient coil. A characteristic value for the output voltage, for example, is ±300 V;

(e) given an optimally high nominal current, the power amplifier must allow an optimally high "duty cycle"; and (f) the power amplifier must be capable of being executed in three-dimensionally small fashion and without a need for liquid coolant, insofar as possible.

The problem of uniform current division into the transistors connected in parallel arises given the parallel connection of many transistors and a high switching speed. Particularly given switch-over events, there is the risk that—due, for example, to inductances—the current division is non-uniform, which can quickly lead to a destruction of transistors.

SUMMARY OF THE INVENTION

It is therefore an object of the invention to construct a power amplifier having a plurality of transistors connected in parallel such that a uniform current division into the transistors is assured.

This object is inventively achieved in that the transistors connected in parallel are respectively secured on a thermally and electrically conductive, first ring, are symmetrically distributed over this ring, and are electrically connected thereto with a respective terminal. The connections to further terminals of the transistors essentially occur in rotationally-symmetrical fashion over large-area printed circuit boards.

By the symmetrical arrangement of the transistors in circular form and the planar design of the connecting line, a uniform division of the current to be switched into the individual transistors is assured at every point in time, even given the highest obtainable switching speeds of approximately 30 ns. Due to the short design of the current paths possible with this structure, harmful inductances are reduced to low values of inductance which are largely the same for the current paths to the individual transistors. Over-voltage peaks that endanger the transistors are thus also avoided when switching.

Additional freewheeling diodes that are mounted in the immediate proximity of the allocated transistor can be advantageously arranged on the first ring. A connection between a transistor and respectively allocated freewheeling diode that is short, and therefore of low-inductance, is thus possible. The low inductance is advantageous, precisely in view of this connection, since the current conduction from the transistor to the allocated freewheeling diode occurs extremely rapidly. Alternatively, the freewheeling diodes can also be arranged on a second ring that is concentric to the first ring and is connected thereto with good thermal conductivity, but is electrically insulated.

An especially advantageous arrangement results when respectively one transistor and one diode are spatially combined and are connected to the supply voltage posts in a series circuit, and when every junction of transistor and diode is connected to a load terminal.

Capacitors can be connected in parallel to the diode-transistor series circuits for absorbing load surges. The capacitors are arranged coaxial to the ring and are connected in large-area fashion to the allocated transistor-diode series circuits via printed circuit boards. This arrangement of the capacitors that act as buffer capacitors for the operating voltage likewise contributes to a uniform current division when the transistors are activated.

The capacitance required for every capacitor can be divided into a plurality of sub-capacitors connected in parallel and having a different capacitance and current surge behavior. Thus, the sub-capacitor having the best current surge behavior is arranged closest to the ring. An expense that is lower overall results due to this division into a plurality of sub-capacitors, since, for example, electrolyte capacitors having high capacitance given low structural volume but relatively poor current surge behavior can be utilized in order to achieve a high capacitance. The surge current required upon turn-on is then first assumed by sub-capacitors having good surge current behavior (for example, film capacitors). These surge current capacitors, however, are significantly larger and more expensive than electrolyte capacitors given the same capacitance. Due to the arrangement of these capacitors close to the transistors, a low inductance of the connection charged with currents having a high rise steepness is achieved.

In an advantageous format, a connection to the transistors occurs via a pin centrally arranged relative to the ring that is connected to the transistors via large-area printed circuit boards. Since the line paths to all transistors are of the same length from this central pin, and thus also have a coinciding inductance, the uniform current distribution is not disturbed by different inductances.

The inductance of the drive lines for all transistors also becomes the same due to an arrangement of the driver circuits for the transistors within the ring, so that a non-uniform current distribution due to different turn-on times of the transistors is avoided.

DESCRIPTION OF THE PREFERRED EMBODIMENTS

Figure 1:
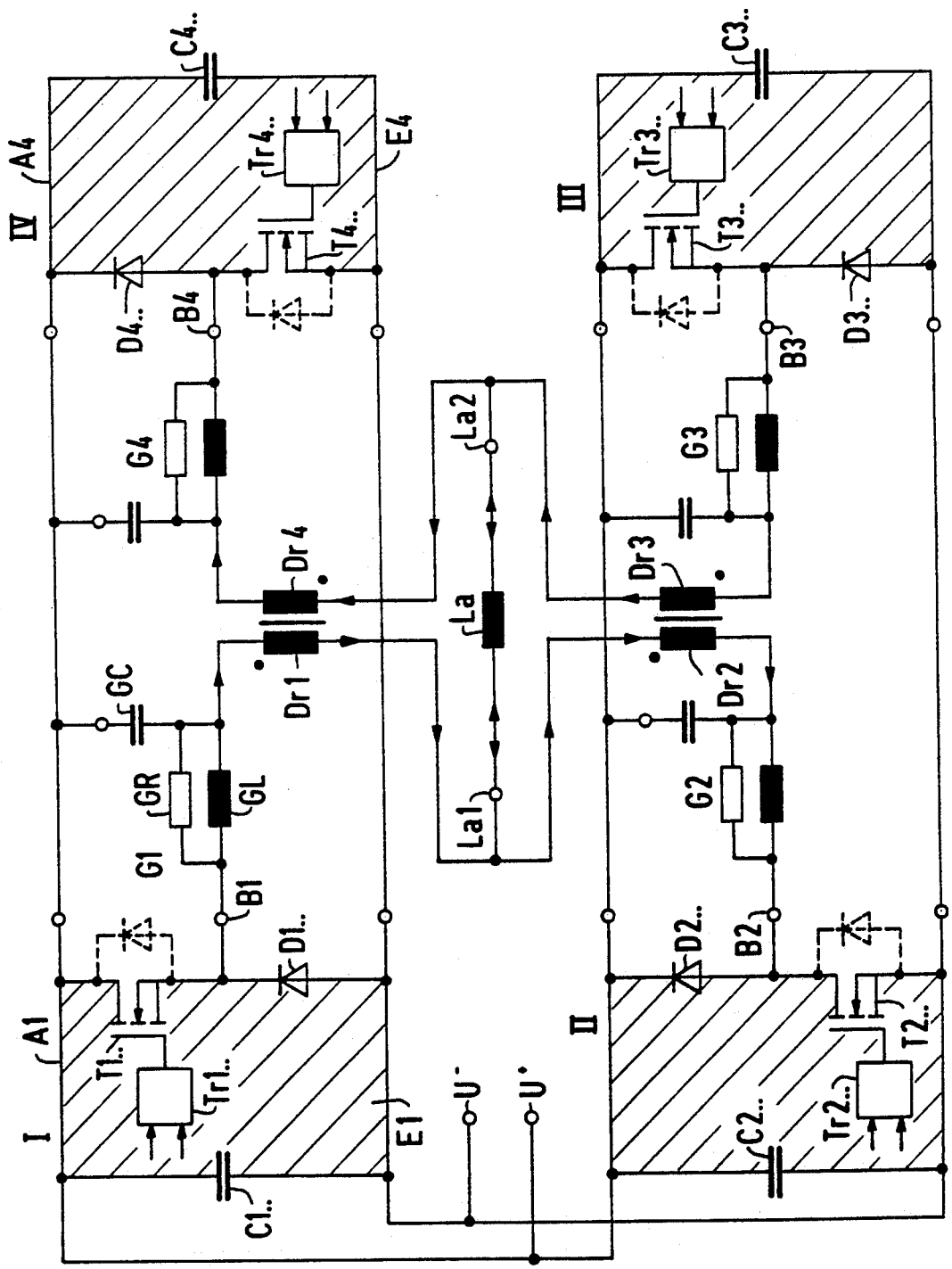
FIG. 1 is a circuit diagram of a power amplifier.

In FIG. 1, the bridge circuit of the power amplifier having the bridge branches I through IV is shown in such fashion that component parts respectively spatially allocated to one another are combined, and the corresponding circuit is cross-hatched. Thus, for example, the bridge branch referenced I is arranged as a circuit unit—as shall be set forth in yet greater detail later—on a first ring; and the bridge branch referenced IV is arranged on a second ring. These two rings are in turn connected to form a structural unit. A second structural unit then contains rings having the circuit elements of the bridge branches II and III.

Every bridge branch contains a plurality of transistors and diodes connected in parallel. In the following, the individual transistors of the bridge branch I shall be specifically referenced T11 through T1n, and as T1 . . . , generally. The references for the bridge branches II through IV correspondingly read T2 . . . through T4 . . . An analogous nomenclature is selected for the diodes and the capacitors of each and every bridge branch.

A diode D1 . . . through D4 is connected in series with every transistor T1 . . . through T4 . . . , whereby this series circuit is connected to supply voltage posts $U^-$ and $U^+$. A capacitor C1 . . . through C4 . . . lies in parallel to each series circuit. Every transistor T1 . . . through T4 . . . is driven by a driver circuit Tr1 through Tr4 per bridge branch. All elements of the bridge branches I through IV, i.e. the transistors T1 . . . through T4 . . . , the diodes D1 . . . through D4 . . . and the capacitors C1 . . . through C4 . . . , are present in multiple fashion, and are connected in parallel.

The junction of each and every transistor T1 . . . to each and every diode D1 . . . (referenced as terminal B1) and the junction of the transistor T2 with the diode D2 (referred to as terminal B2) are respectively connected to a first terminal La1 of the load La via a smoothing filter G1 or, respectively, G2 and via an inductor Dr1 or, respectively, Dr2. The corresponding terminals B3 and B4 are connected to the second terminal La2 of the load La via smoothing filters G3 or, respectively, G4 and inductors Dr3 or, respectively, Dr4. Every smoothing filter G1 through G4 is designed as a RC element having the parallel circuit of an inductance GL and a resistor GR in series with the load current, and having a capacitor GC that produces a connection to a voltage supply post.

The load La can be charged with a current in a first direction by activating the transistors T1 . . . and T4 . . . , and can be charged with a current in the opposite direction by activating the transistors T2 . . . and T3 . . . . When a current path is switched off, the load current that continues to flow because of the inductance of the load La is assumed by the allocated diodes D1 . . . through D4 . . . , i.e., for example, by the diodes D1 . . . and D4 . . . when the transistors T1 . . . and T4 . . . are switched off. The capacitors C1 . . . through C4 . . . serve as intermediate circuit capacitors, i.e. as operating voltage buffer capacitors, and permit short current rise times without extreme conditions with respect to the inductance of the operating voltage source. The smoothing filters G1 through G4 serve the purpose of filtering the switching peaks when switching the transistors T1 . . . through T4 . . . .

The inductors Dr1 through Dr4 have a two-fold function: first, they prevent an excessively rapid current rise when the transistors T1 . . . and T2 . . . or, respectively, T3 . . . and T4 . . . are simultaneously activated due to an error. Moreover, the following problem is resolved by the inductors Dr1 through Dr4: every MOSFET transistor has an inherent diode that is shown in broken lines for every transistor T1 . . . through T4 . . . . This diode fundamentally acts as a freewheeling diode but has a long switching time, i.e. reverse recovery time, in comparison to the transistor path. Given the activation of the other transistor in the shunt arm (for example, of T1 . . . after T2 . . . ), the reverse recovery would cause an inadmissibly high transverse current that, in addition to potentially resulting in significantly higher switching losses, could also result in the destruction of the transistors. What is achieved, however, as a result of the inductors Dr1 through Dr4 is that the load current can only commute via these inductors into an inherent diode, whereas a commutation into the significantly faster diodes D1 through D4 occurs without interposition of an inductor, and thus is significantly faster. The inherent diodes have thus become practically ineffective and their disturbing effect is thus eliminated.

In order to keep the structural volume of the inductors Dr1 through Dr4 within limits, it is necessary to avoid the saturation of the inductor cores due to the output current. This is achieved in that the inductors Dr1 and Dr4 or, respectively, Dr2 and Dr3 are respectively wound on a common core with a suitable winding direction. The field generated by the load current is thereby respectively compensated, i.e. the inductors are current-compensated. The above-recited function in the current commutation is therefore not deteriorated.

Every bridge branch is formed of a plurality of transistors T1 . . . through T4 . . . , diodes D1 . . . through D4 . . . and capacitors C1 . . . through C4 . . . connected in parallel, whereof only respectively one element is shown in FIG. 1. Only in this way can, for example, the current-carrying ability necessary for gradient amplifiers be achieved with MOSFET transistors. As was likewise already discussed at the outset, however, the problem of uniform current division particularly upon turn-on arises with the parallel connection of the transistors. A uniform current division is achieved with a structural arrangement as shown in FIGS. 2 and 3 as an exemplary embodiment of the invention.

Figure 2:
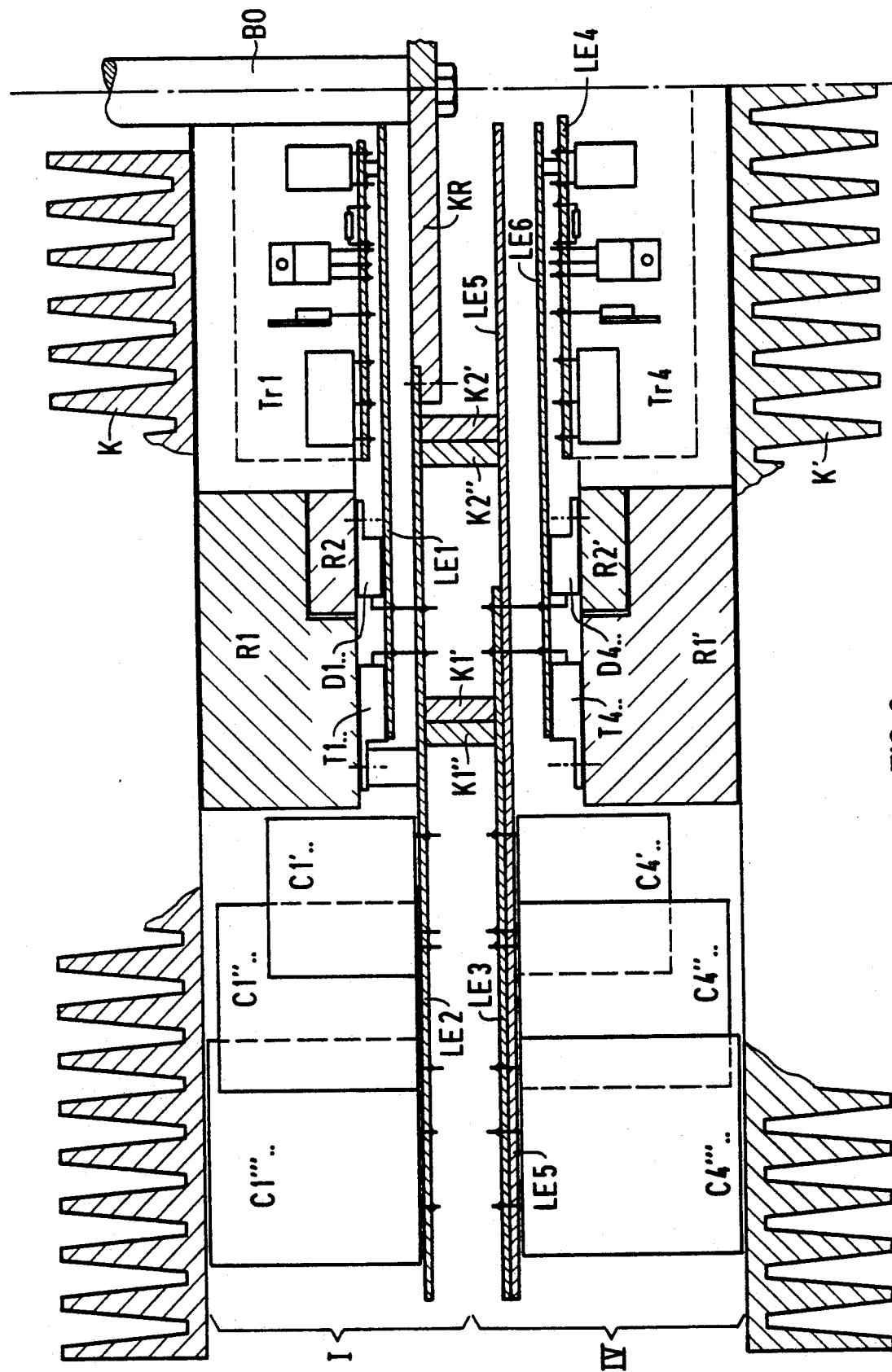
FIG. 2 is a section through one side of a rotational-symmetrical structural unit.
Figure 3:
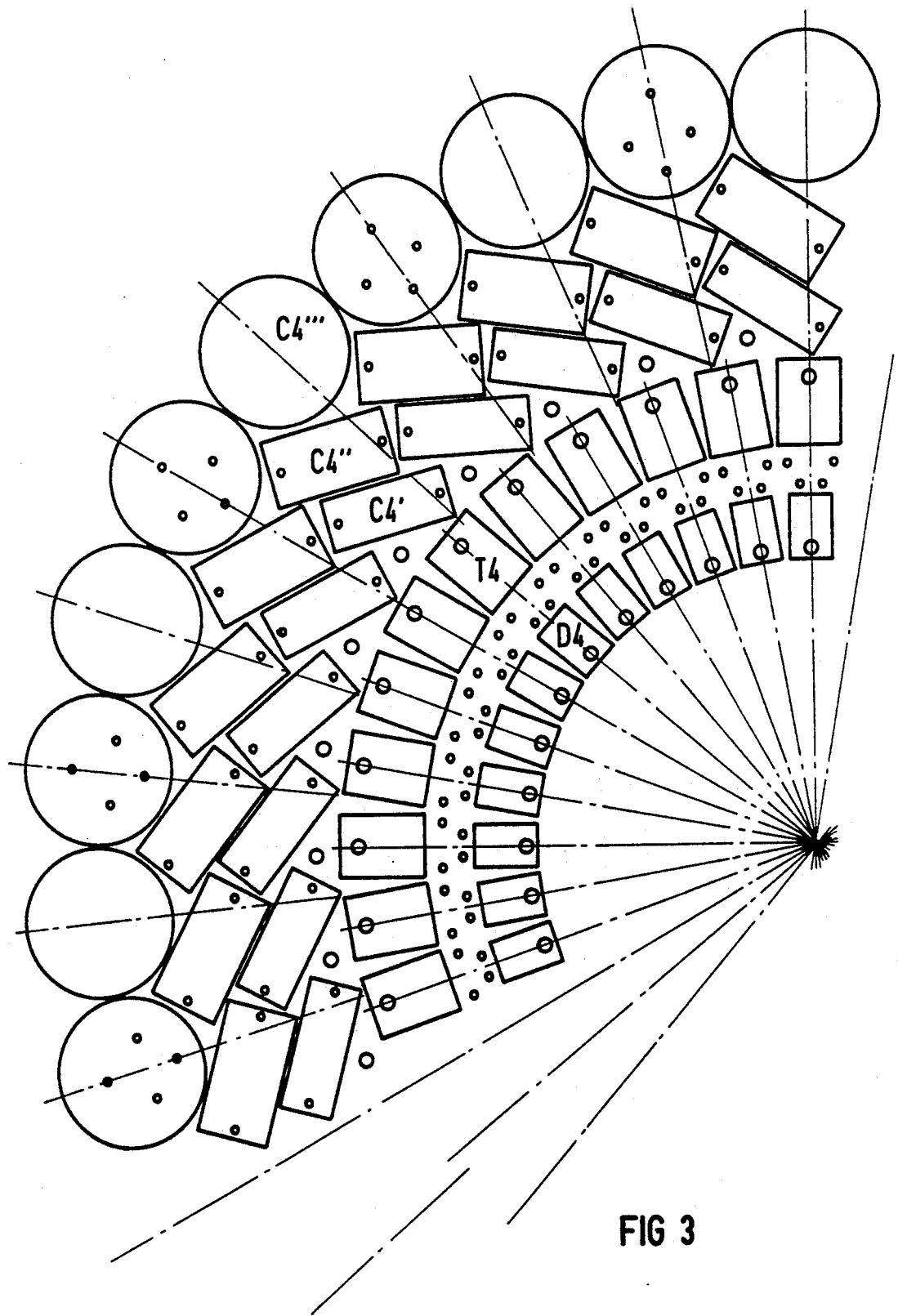
FIG. 3 is a plan view onto the same structural unit.

In cross section, FIG. 2 shows a structural unit that contains a bridge half, namely the bridge branches I and IV of FIG. 1. The structural unit is constructed in rotationally-symmetrical fashion with respect to the axis shown with dot-dash lines, and only the left-hand part of the structural unit is shown for the sake of clarity.

The transistors T1 . . . or, respectively, T4 . . . allocated to the bridge branches I or, respectively, IV are arranged on two first rings R1 or, respectively, R1'. Electrically insulated rings R2 or, respectively, R2' which, however, have good thermal conductivity, are introduced into a recess of the rings R1 or, respectively, R1'. Freewheeling diodes D1 . . . or, respectively, D4 . . . are arranged on these rings R2, R2'. The rings R1, R1', R2, R2' are preferably composed of aluminum. The transistors T1 . . . and T4 . . . and freewheeling diodes D1 . . . and D4 . . . are conducted to the rings R or, respectively, R' with good thermal conductivity, so that the dissipated power is eliminated onto the rings R and R'. The rings R and R' are in turn each connected with good thermal conductivity to an air cooling member K or, respectively, K' via which the dissipated power is eliminated to the ambient air.

Sub-capacitors C1' through C1''' are arranged concentrically relative to the transistor T1, T4. The concentric arrangement of the diodes, of the transistors, and of the sub-capacitors on respectively different radii may be clearly seen in FIG. 3.

Respectively three capacitors C1'. . . through C1''' . . . or, respectively, C4' . . . through C4''' . . . in parallel circuitry form a capacitor C1 . . . or, respectively, C4 . . . according to the circuit diagram of FIG. 1. The capacitors C1'. . . or, respectively, C4' . . . on the smallest radius are thus designed as film capacitors and have an especially good surge current behavior, i.e. low internal resistance and inductance. Due to the shortest distance from the transistors, they contribute to the rapid current rise upon turn-on. As a result of their structure, such capacitors, however, have only low values of capacitance. The capacitors C1'' . . . or, respectively, C4'' . . . somewhat farther from the transistors have a medium surge current behavior but a greater capacitance, and are likewise preferably designed as film capacitors. Finally, the major part of the required capacitance is formed by the capacitors C1''' or, respectively, C4''' which are preferably designed as electrolyte capacitors and are arranged on the greatest radius. Although such capacitors have a high capacitance, they nonetheless have a less beneficial surge current behavior in comparison to film capacitors.

The driver circuits TR1, TR4 required for the drive of the transistors are likewise arranged coaxially relative to the ring R or, respectively, R', and within this ring. Printed circuit boards that respectively produce a short, large-area connection having low inductance are provided for connecting the components to one another. A sandwich structure of a plurality of printed circuit boards effects a coupling-free, symmetrical and low-inductance contacting of the components, whereby optimum conductor cross sections can be designed by division into a plurality of interconnect levels. Overvoltage peaks given fast switching events that are dangerous for the transistors are avoided by the low inductance of the connecting lines. On the basis of a suitable design of metal coats of the printed circuit boards lying opposite one another, extremely low-inductance, additional storage capacitors at the shortest possible distance from the transistors can be additionally realized which can cover the energy requirement for fastest current peaks. Two concentric contact rings K1 and K2 are provided for the releasable connection of the components of the two bridge branches I and IV to one another. These contact rings are each respectively formed of two contact tracks K1', K1'' or, respectively, K2', K2'', whereby at least one of the two contact tracks of each and every contact ring is designed in the form of resilient lamellae. The contact tracks K1' are conductively connected to the ring R via stud bolts ST. A pin B0, which is connected via a circular disc KR to the printed circuit board LE1, is provided at the central axis of the arrangement. The current path in the arrangement of FIG. 2 shall be set forth in greater detail below, in combination with the circuit diagram of FIG. 1. The positive supply voltage terminal U+ is connected to the ring R1. This connection is consistently referenced A1 in FIGS. 1 and 2. The connection of the diode D4 . . . to the positive operating voltage terminal occurs via the contact ring K1 and via the printed circuit board LE3. This connection is respectively referenced L1. The terminal of the negative operating voltage U− is connected to transistor T4 . . . via the printed circuit board LE5 and is also connected to the transistor T1 . . . via the printed circuit board LE5, the contact ring K2, and the printed circuit board LE2. The sub-capacitors C1' through C1''' are connected to the positive and negative operating voltage via the printed circuit board LE2, and the capacitors C4' through C4''' are connected thereto via the printed circuit boards LE3 and LE5. The load terminal B1 of FIG. 1 is produced with the pin B0 which is connected to the junction of transistor T1 . . . and diode D1 . . . via the disc KR and via the printed circuit board LE2. The load connection of the bridge branch IV referenced B4 in FIG. 1 is produced via the ring R1' to which a respective terminal of the transistor T4 . . . and of the diode D4 . . . is likewise connected.

The drive of the transistors T1 . . . or, respectively, T4 . . . by the driver circuits TR1 or, respectively, TR4 occurs via printed circuit boards LE1 or, respectively, LE4.

Short connecting paths to the components are assured due to the consistent structure of the arrangement in coaxial form. Furthermore, the connecting paths to all components are of the same length, so that the lead inductances coincide. This is a significant prerequisite for achieving a uniform current division, even in the dynamic case. A uniform elimination of the waste heat from all transistors and diodes is also guaranteed by this structure. All transistors and freewheeling diodes therefore work at the same temperature, this representing a further prerequisite for the uniform current division.

Due to the extremely high switching speed that is permitted with the illustrated arrangement, a further problem must also be resolved, this being set forth in greater detail below with reference to FIG. 4.

Figure 4:
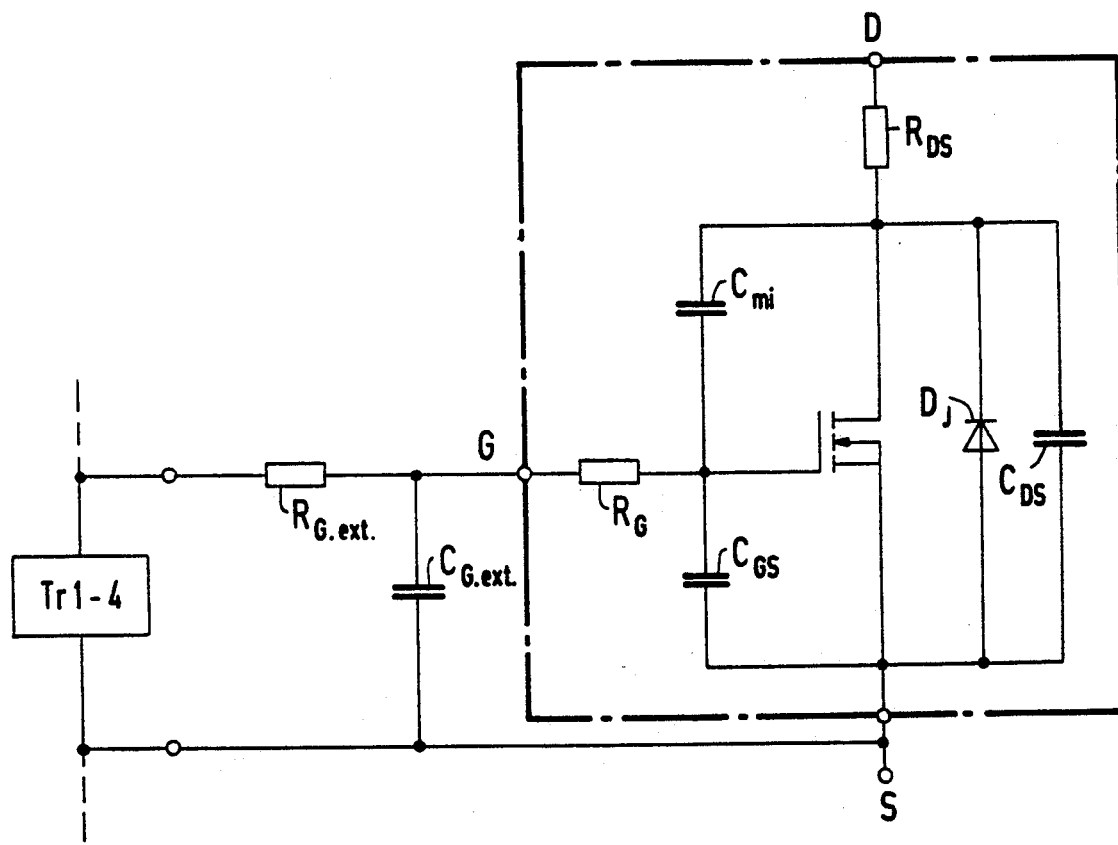
FIG. 4 is an example of the drive of a MOSFET transistor.

FIG. 4 shows the equivalent circuit diagram of a MOSFET transistor with an inherent diode $D_j$, the drain-source capacitance $C_{DS}$, the drain-gate capacitance $C_{mi}$, the gate-source capacitance $C_{GS}$, the gate resistance $R_G$, and the drain-source resistance $R_{DS}$. The drain-gate capacitance also acts as a feedback capacitance.

The following problem arises, given the common drive of a great number of MOSFET transistors connected in parallel: higher gate impedances necessarily result due to the spatial arrangement of the transistors in the parallel circuit since the distances of the gate terminals from the common driver terminal become correspondingly greater. When the transistors are turned on, oscillations at the gate that result in a brief re-turnoff can then arise via the feedback capacitance ($C_{mi}$ according to FIG. 4) upon turn-on of the transistors. The switching losses would rise greatly as a result thereof. In order to be able to nonetheless switch reliably and quickly, an additional capacitor ($C_{Gext}$) is connected to every gate-source terminal of every MOSFET transistor (FIG. 4). The parasitic capacitances of the MOSFET transistors are highly dependent on the drain-source voltage. This dependency is diminished with the elevation of the input capacitance by an external capacitor. The effect of the feedback capacitance rising upon turn-on is weakened since the impedance at the gate was reduced.

The external gate-source capacitors are situated on the printed circuit boards LE1 as well as LE6 (FIG. 2), and are spatially allocated to every transistor. With low driver power, this technique makes it possible to rapidly switch many MOSFET transistors connected in parallel with low-losses.

Although various minor changes and modifications might be proposed by those skilled in the art, it will be understood that we wish to include within the claims of the patent warranted hereon all such changes and modifications as reasonably come within our contribution to the art.

We claim as our invention:

1. A power amplifier for feeding an inductance, comprising:
   first, second, third, and fourth transistor means for switching arranged in a bridge circuit in a diagonal of which the inductance is connected at first and second load terminals;
   each of the first through fourth switching transistor means having a respective first through fourth freewheeling diode means connected thereto for assuming current flow of the respective switching transistor means when the transistor means is turned off;
   the first through fourth switching transistor means each being respectively provided in a respective bridge branch of the bridge circuit;
   thermally and electrically conductive first rings;
   the first through fourth switching transistors means each comprising a plurality of individual transistors connected in parallel and secured in a uniformly distributed manner on the respective four first rings;
   a respective terminal for each individual transistor electrically connecting the individual transistors to the respective first rings; and
   large-area printed circuit board means for connecting to further terminals of the individual transistors in substantially rotational symmetric fashion.

2. A power amplifier according to claim 1 wherein the freewheeling diode means comprises a plurality of individual freewheeling diodes each connected to a respective one of the individual transistors, and wherein each of the individual respective freewheeling diodes is arranged on the respective first rings and is mounted in an immediate proximity of its respective transistor to which it is connected.

3. A power amplifier according to claim 1 wherein the freewheeling diode means comprises a plurality of individual freewheeling diodes each connected to a respective one of the individual transistors, and wherein each of the individual respective freewheeling diodes is arranged on a respective second ring which is concentric to the respective first ring and which is thermally connected thereto with good thermal conductivity but is electrically insulated therefrom.

4. A power amplifier according to claim 1 wherein the freewheeling diode means comprises a plurality of individual respective freewheeling diodes each connected in series with each of the respective individual transistors and wherein first and second supply voltage posts are provided for connecting to the bridge circuit, and wherein each of the individual transistors with its associated individual freewheeling diode is connected in series between the first and second supply voltage posts, and wherein every junction of each individual transistor and each respective individual diode connects to one of said first and second load terminals.

5. A power amplifier according to claim 4 further comprising individual capacitors respectively connected parallel to each of the individual transistor and diode series circuits and wherein the individual capacitors are coaxially arranged relative to the respective first rings and are connected to the respective transistor-diode series circuits via printed circuit boards.

6. A power amplifier according to claim 5 wherein each of the individual capacitors comprises a plurality of sub-capacitors which are connected in parallel and have different capacitance and surge current behavior, and wherein the sub-capacitor having a best surge current behavior is arranged closest to the first ring.

7. A power amplifier for feeding an inductance, comprising:
   first, second, third, and fourth transistor means for switching arranged in a bridge circuit in a diagonal of which the inductance is connected at first and second load terminals;
   each of the first through fourth switching transistor means having a respective first through fourth freewheeling diode means connected thereto for assuming current flow of the respective switching transistor means when the transistor means is turned off;
   the first through fourth switching transistor means each being respectively provided in a respective bridge branch of the bridge circuit; p1 thermally and electrically conductive first rings;

the first through fourth switching transistor means each comprising a plurality of individual transistors connected in parallel and secured in a uniformly distributed manner on the respective four first rings;

a respective terminal for each individual transistor electrically connecting the individual transistors to the respective first rings;

large-area printed circuit board means for connecting to further terminals of the individual transistors in substantially rotational symmetric fashion; and a pin means centrally arranged relative to the first ring for providing an electrical connection to the individual transistors via large-area printed circuit boards.

8. A power amplifier according to claim 7 further comprising first through fourth driver circuit means provided for the first through fourth transistor means, the first through fourth driver circuit means being arranged inside the respective four first rings associated with each of the first through fourth respective transistor means.

9. A power amplifier according to claim 1 wherein each of the individual transistors has a capacitor connected in parallel with a gate/source path thereof.

10. A power amplifier for feeding an inductance, comprising:

first, second, third, and fourth transistor means for switching arranged in a bridge circuit in a diagonal of which the inductance is connected at first and second load terminals;

each of the first through fourth switching transistor means having a respective first through fourth freewheeling diode means connected thereto for assuming current flow of the respective switching transistor means when the transistor is turned off;

the first through fourth switching transistor means each being respectively provided in a respective bridge branch of the bridge circuit;

thermally and electrically conductive first rings;

the first through fourth switching transistor means each comprising a plurality of individual transistors connected in parallel and secured in a uniformly distributed manner on the respective four first rings;

a respective terminal for each individual transistor electrically connecting the individual transistors to the respective first rings;

large-area printed circuit board means for connecting to further terminals of the individual transistors in substantially rotational symmetric fashion; and cooling means thermally conductively connected to each of the four first rings.

11. A power amplifier according to claim 10 further comprising two of the four first rings being allocated to one half of the bridge circuit and two of the four first rings being allocated to another half of the bridge circuit, the two rings allocated to each half being combined to form a structural unit such that the cooling means comprises a first cooling member lying outwardly of and parallel to one of the rings and second cooling member lying outwardly of and parallel to a second of the rings.

12. A power amplifier according to claim 1 further comprising two of the four first rings being allocated to one half of the bridge circuit and the other two of the first rings being allocated to the other half of the bridge circuit, and wherein the two rings associated with each half of the bridge circuit are combined to form a structural unit; and concentric contact ring means being provided between the two rings for releasable electrical connection of electrical components associated with the rings.

13. A power amplifier according to claim 1 further comprising first and second operating voltage terminals provided for the bridge circuit and wherein each of the first through fourth transistor means has connected to it a respective first through fourth inductor having a first end connected to the respective transistor means and a second end connected to respective first or second load terminals to which the load inductance is connected.

14. A power amplifier according to claim 13 wherein pairs of the four inductors are inductively coupled together.

15. A power amplifier for feeding an inductance, comprising:

first, second, third, and fourth transistor means for switching arranged in a bridge circuit in a diagonal of which the inductance is connected at first and second load terminals;

each of the first through fourth switching transistor means having a respective first through fourth freewheeling diode means connected thereto assuming current flow of the respective switching transistor means when the transistor means is turned off;

the first through fourth switching transistor means each being respectively provided in a respective bridge branch of the bridge circuit;

thermally and electrically conductive first rings;

the first through fourth switching transistor means each comprising a plurality of individual transistors connected in parallel and secured in a uniformly distributed manner on the respective four first rings;

a respective terminal for each individual transistor electrically connecting the individual transistors to respective first rings;

large-area printed circuit board means for connecting to further terminals of the individual transistors in substantially rotational symmetric fashion; and each of the first through fourth transistor means defining a bridge branch and wherein a low-pass filter means is provided in each load branch.

16. A power amplifier according to claim 1 wherein each of the first through fourth switching transistor means comprises an MOSFET.

17. An inductive load power amplifier for feeding an inductive load, comprising:

first, second, third, and fourth transistor means for switching arranged in respective bridge branches of a bridge circuit, a diagonal of the bridge circuit having first and second load terminals for connecting to the inductive load;

each of the first through fourth switching transistor means having a respective first through fourth freewheeling diode means connected thereto for assuming current flow of the respective switching transistor means when the transistor means is turned off;

four thermally and electrically conductive rings;

the first through fourth switching transistor means each comprising a plurality of individual transistors connected in parallel and positioned in uniformly distributed manner on the respective four rings; and large-area printed circuit board means for connecting to terminals of the individual transistors in substantially rotational symmetric fashion.

18. An inductive load power amplifier for feeding an inductive load, comprising:

transistor means for switching arranged in a bridge circuit, a diagonal of the bridge circuit having first and second load terminals for connecting to the inductive load;

the transistor means having freewheeling diode means connected thereto for assuming current flow of the switching transistor means when the transistor means is turned off;

a thermally and electrically conducting ring;

said switching transistor means comprising a plurality of individual transistors connected in parallel and positioned in uniformly distributed manner on the ring; and printed circuit board means for connecting to terminals of the individual transistors in substantially rotational symmetric fashion.

* * * * *